(12) United States Patent
Takabayashi et al.

(10) Patent No.: US 6,732,335 B2
(45) Date of Patent: May 4, 2004

(54) SEMICONDUCTOR IC WITH AN INSIDE CAPACITOR FOR A POWER SUPPLY CIRCUIT AND A METHOD OF AUTOMATICALLY DESIGNING THE SAME

(75) Inventors: Yasutaka Takabayashi, Tokyo (JP); Masashi Morimoto, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/127,689

(22) Filed: Apr. 23, 2002

(65) Prior Publication Data

US 2003/0200509 A1 Oct. 23, 2003

(51) Int. Cl.[7] .......................... G06F 17/50; H01L 29/00
(52) U.S. Cl. ..................... 716/1; 257/532; 716/1; 716/8; 716/10; 716/12
(58) Field of Search .................... 716/1, 8, 10, 12; 257/532

(56) References Cited

U.S. PATENT DOCUMENTS

| | | | | |
|---|---|---|---|---|
| 6,054,751 A | * | 4/2000 | Ichikawa et al. | 257/532 |
| 6,093,214 A | * | 7/2000 | Dillon | 716/17 |
| 6,147,857 A | * | 11/2000 | Worley et al. | 361/301.2 |
| 6,170,079 B1 | * | 1/2001 | Kato et al. | 716/10 |
| 6,430,735 B2 | * | 8/2002 | Uchida | 716/12 |
| 6,434,730 B1 | * | 8/2002 | Ito et al. | 716/8 |
| 6,591,406 B2 | * | 7/2003 | Ishikawa | 716/8 |

FOREIGN PATENT DOCUMENTS

| | | |
|---|---|---|
| JP | 61-61437 | 3/1986 |
| JP | 7-106521 | 4/1995 |
| JP | 2682397 | 8/1997 |
| JP | 2000-58751 | 2/2000 |
| JP | 2000-68476 | 3/2000 |
| JP | 2000-277618 | 10/2000 |

* cited by examiner

Primary Examiner—Vuthe Siek
Assistant Examiner—Magid Y Dimyan
(74) Attorney, Agent, or Firm—Volentine Francos, PLLC

(57) ABSTRACT

A semiconductor IC (Integrated Circuit) has blocks implemented as a standard cell each. Wirings are arranged in a wiring region for wiring the connections of circuit devices of a standard cell, which constitute utility circuit. A first and a second electrode each are formed in a particular polycrystalline silicon layer in the wiring region different from a layer assigned to the wirings. Either of the two electrodes is connected to a power supply while the other is connected to ground, forming a capacitance between the overlapping portions thereof.

10 Claims, 14 Drawing Sheets

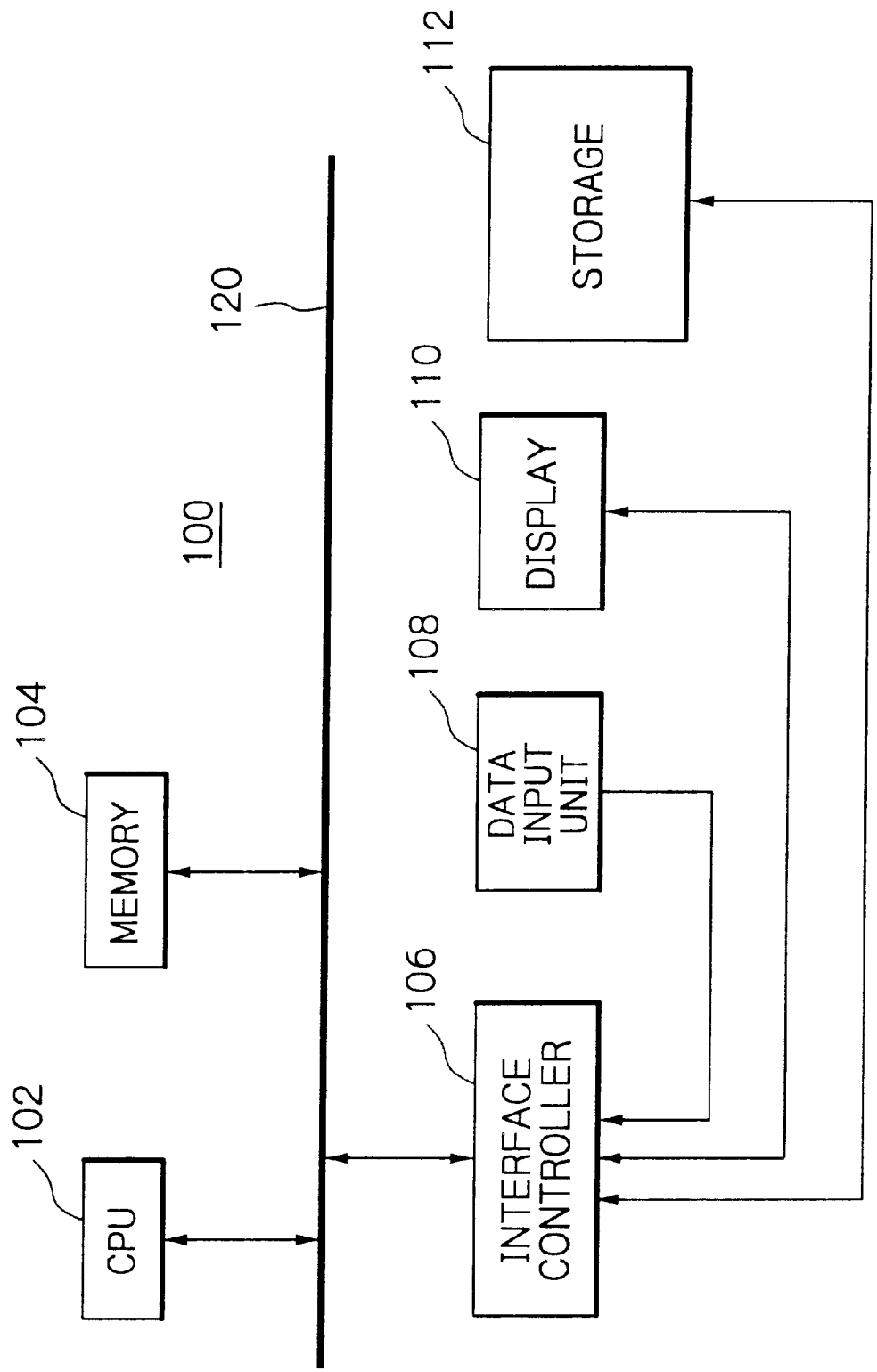

SEMICONDUCTOR IC WITH AN INSIDE CAPACITOR FOR A POWER SUPPLY CIRCUIT AND A METHOD OF AUTOMATICALLY DESIGNING THE SAME

BACKGROUND OF THE INVENTION

1. Field of the Invention

The present invention relates generally to an LSI (Large-Scale Integrated circuit) and more particularly to a semiconductor IC (Integrated Circuit) including a capacitor for a power supply circuit that prevents supply voltage from fluctuating in dependent upon inside loads. The present invention also relates to a method of automatically designing such a semiconductor IC, more specifically the layout of circuit devices, especially capacitors, to be integrated on the basis of unit cells constituting circuit regions.

2. Description of the Background Art

Generally, a semiconductor device has thereinside a power supply circuit and a utility circuit operable with a voltage fed from the power supply circuit for processing signals. The utility circuit is, e.g., a circuit that produces a desired signal from a signal input from the outside. The power supply circuit is expected to apply a stable power supply voltage to the utility circuit. In practice, however, the power supply voltage output from the power supply circuit varies dependently upon the loads of the utility circuit.

It is a common practice with a semiconductor device to insert a capacitor between a power supply line and ground in order to reduce the variation of the power supply voltage. In a semiconductor device, parts constituting a power supply circuit, a utility circuit and a capacitor are laid out with consideration given to the characteristics of the individual parts. Some prior art layouts of a semiconductor device will be described hereinafter.

Japanese patent laid-open publication No. 2000-277618 proposes an LSI arranging method for a standard cell type of LSI design. To sufficiently reduce power supply noise for the stabilization of a power supply, the LSI arranging method disclosed by the publication uses a power supply capacitance cell as one of the standard cells. The capacitance of the power supply capacitance cell is selected in accordance with the drive load capacitance of logic gate cells, which are other standard cells. The power supply capacitance cell is positioned in the vicinity of the logic gate cells.

Japanese patent laid-open publication No. 2000-68476 discloses a semiconductor device including a cell region where logic gate cells are placed and a wiring region where wirings are arranged for connecting the logic gate cells. A capacitance cell is formed at the same level as the logic gate cells in a direction perpendicular to a substrate, and connected to a power supply line. The capacitance cell is automatically placed in the idle portion of the cell region and automatically routed to the other cells that constitute the logic gate cells. This configuration removes the step of laying out level-stabilizing capacitance on a semiconductor device, thereby reducing the total number of fabrication steps.

Japanese patent No. 2682397 teaches a semiconductor IC device which is cell-base designed to obviate an extra space exclusive for a bypass capacitor which would otherwise be required ascribable to the limited capacitance available with each cell, thereby preventing a chip size from increasing to enhance the resistance to noise of an LSI. For this purpose, basic cell, capacitive devices include a group of first MISFETs (Metal-Insulator Semiconductor Field-Effect Transistors) and a group of second MISFETs different in planar shape from the first MISFETs. Capacitive devices are formed between the gate electrodes of the second group of MISFETs and a first and a second power supply voltage feed line. The basic cell, capacitive devices are arranged between function blocks or between block cells.

Japanese patent laid-open publication No. 2000-58751 discloses a semiconductor IC configured to implement stabler synchronization matching with operational frequency, which is increasing today and synchronous to a clock signal. For this purpose, the semiconductor IC includes a first and a second power supply wiring, and a capacitance and a clock driver that are positioned immediately beneath and connected to both of the power supply wirings. The clock driver obviates, in the vicinity of the capacitance, the variation of a power supply voltage ascribable to the charge and discharge of the above capacitance.

Japanese patent laid-open publication No. 106521/1995 proposes a cell-base designed, semiconductor ID device including an n-channel MOS (Metal-Oxide Semiconductor) transistor and a p-channel MOS transistor. The n-channel MOS transistor has a source electrode connected to ground while the p-channel MOS transistor has a gate electrode and a source electrode connected to ground and a power supply, respectively. The two MOS transistors form a capacitor cell for reducing noise ascribable to the operation of an LSI logic circuit.

As for a master slice type of semiconductor IC, Japanese patent laid-open publication No. 61437/1986 teaches that a basic cell positioned in the device region of a semiconductor substrate, but not used for utility, is used as a capacitor. The capacitor is connected between a power supply and ground for absorbing power supply noise, contributing to the stabilization of the device.

The prior art configurations described above use MOS capacitance devices without exception. Although capacitors implemented by MOS capacitance devices are thin and attain a great capacitance, they are apt to interfere with circuits adjoining them. The interference may be reduced if the region forming MOS capacitance is reduced in size or if an exclusive anti-interference region is formed. However, the size reduction of the region forming MOS capacitance blocks a desired capacitance from being attained while the anti-interference region increases the total chip area.

Further, the p-channel and n-channel MOS transistors are formed over the potential wells or on a substrate independently of each other. Such two types of MOS transistors may be formed in group and side by side to function as MOS capacitance devices for various circuits, but cannot be configured to straddle across each other. More specifically, even when the two types of transistors are thus mounted together, only one type of MOS capacitance devices can be used when functioning as capacitance in the active state thereof. It will therefore be seen that MOS capacitance devices lower the mounting efficiency of capacitors in a semiconductor circuit.

SUMMARY OF THE INVENTION

It is an object of the present invention to provide a semiconductor IC with mounting efficiency increased and stabler power supply insured, and an automatic designing method therefor.

In accordance with the present invention, a semiconductor IC includes a power supply circuit for feeding a voltage to a utility circuit, and a stabilizing circuit for stabilizing the voltage to be applied from the power supply circuit to the utility circuit. The stabilizing circuit includes a first and second electrode. The IC has regions divided into a plurality of blocks each constituting a standard cell. A first electrode is formed in the wiring region for wiring the connections of circuit devices in a standard cell that forms the utility circuit, but formed in a layer different from a layer in which the wiring is formed. A second electrode is formed in a layer different from the layer of the wiring and the layer of the first electrode. Either of the first and second electrodes is connected to a power supply while the other is connected to ground. The first and second electrodes at least partly overlap each other in a direction normal to a plane containing them, thereby forming a capacitance between the layer of the first electrode and the layer of the second electrode.

Also, in accordance with the present invention, a method of automatically designing an IC including a power supply circuit for feeding a voltage to a utility circuit and a stabilizing circuit for stabilizing the voltage begins with the step of dividing the IC into a plurality of block regions, and subdividing each block region into subregions each being implemented as a standard cell. The unit subregions are classified into a subregion for the utility circuit and a subregion for wiring necessary for the utility circuit. The number of standard cells is determined which adjoin each other in an idle subregion not classified in the step of classifying. If the number of standard cells in the idle subregion is greater than a preselected number, the standard cells are coupled and each of a first and a second electrode is formed in a particular layer in the idle subregion. The first and second electrode least partly overlap each other in a direction normal to a plane containing them, thereby forming a capacitance between the layers of the first and second electrodes.

BRIEF DESCRIPTION OF THE DRAWINGS

The objects and features of the present invention will become more apparent from consideration of the following detailed description taken in conjunction with the accompanying drawings in which:

FIG. 13 is a schematic block diagram showing a specific configuration of an automatic LSI designing system applicable to the illustrative embodiments.

DESCRIPTION OF THE PREFERRED EMBODIMENTS

Figure 1:
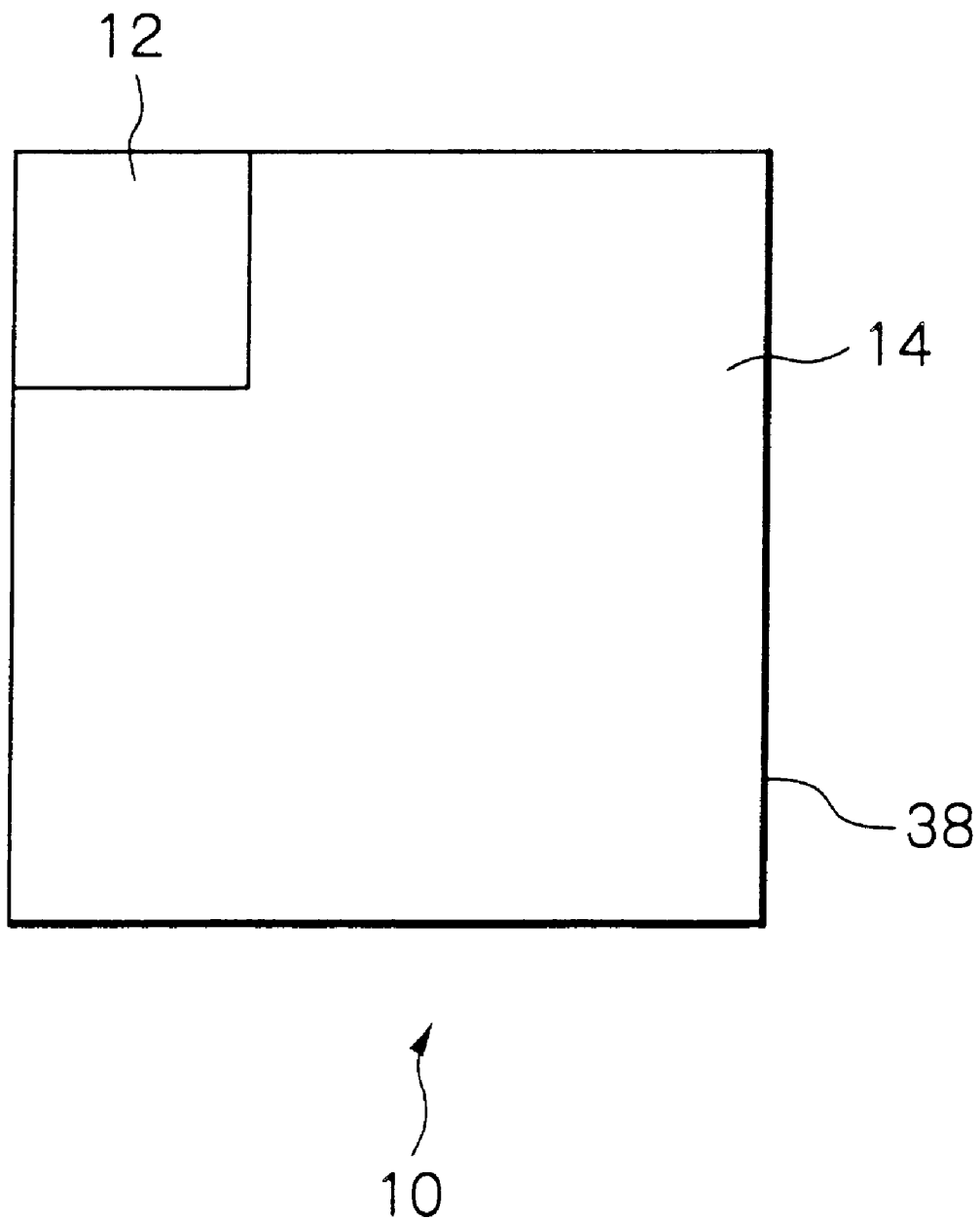
FIG. 1 is a plan view schematically showing the general layout of an embodiment of a semiconductor IC in accordance with the present invention.

Referring to FIG. 1 of the drawings, a semiconductor LSI in accordance with an embodiment of the present invention is generally designated by the reference numeral 10. As shown, the LSI 10 includes a semiconductor substrate 38. An internal circuit portion or utility circuit 14 and a power supply portion 12 are arranged on the substrate 38.

Figure 2:
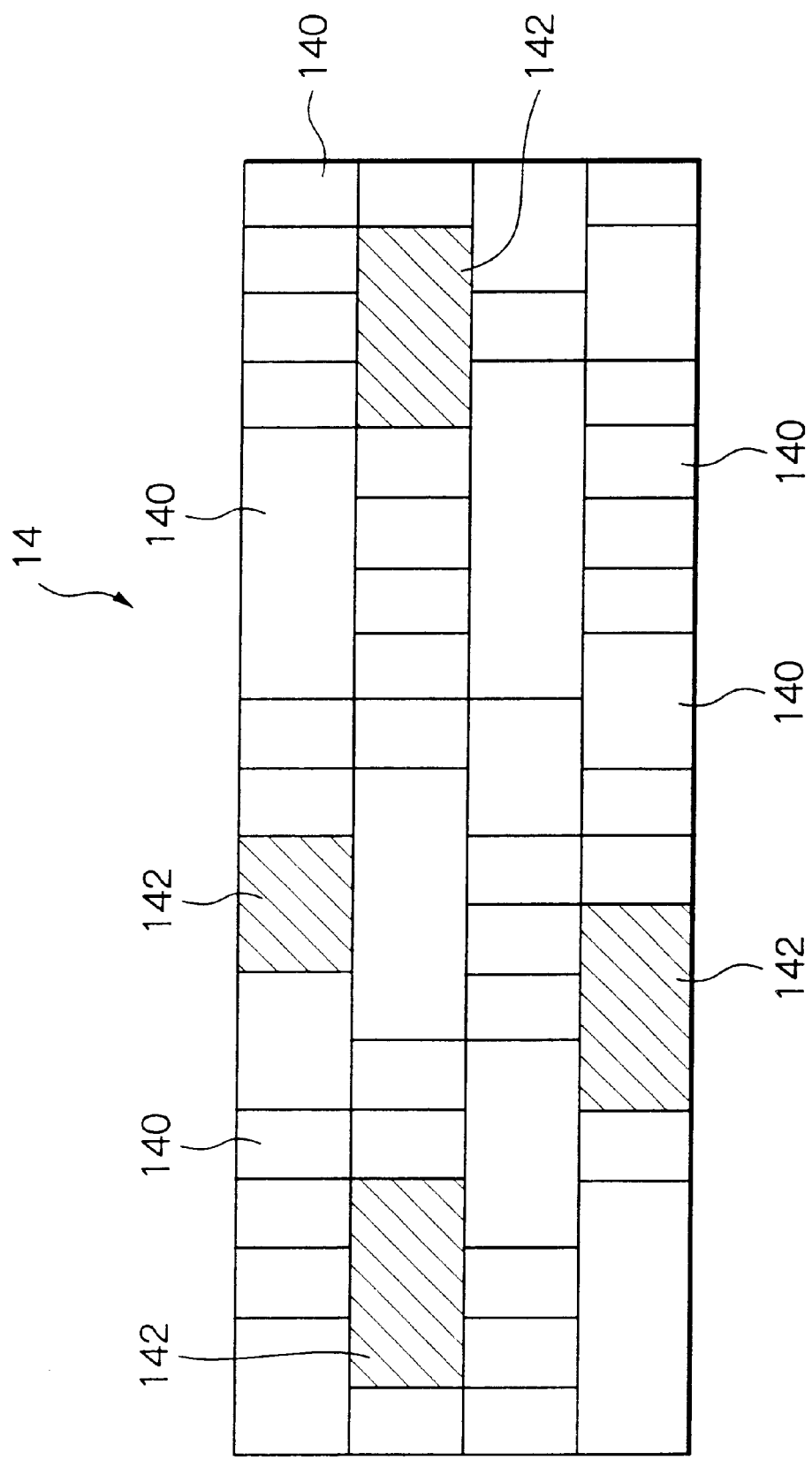
FIG. 2 is a plan view schematically showing the layout of logic circuit regions and wiring regions arranged in an internal circuit, which is included in the semiconductor IC shown in FIG. 1.

FIG. 2 shows essential part of the internal circuit portion 14. The internal circuit portion 14 includes, e.g., logic circuit regions 140 and wiring regions 142 represented by blank regions and hatched regions, respectively, and exmeplarily disposed as shown. Today, LSI design is automated to avoid time- and labor-consuming work ascribable to the scale of devices on an LSI that is increasing in parallel with the progress of large-scale integration technologies. The automation of LSI design is achievable with, e.g., a multilayer wiring process, logic circuit design or layout design. In the illustrative embodiment, automatic LSI design is applied to the logic circuit regions 140 and wiring regions 142. Each logic circuit region 140 includes inverters, NAND gates, NOR gates, AND gates, OR gates, latches, flip-flops and other various gate and logic devices arranged under specific circuit conditions. Each wiring region 142 connects such gate devices of the associated logic circuit regions 140.

Figure 3:
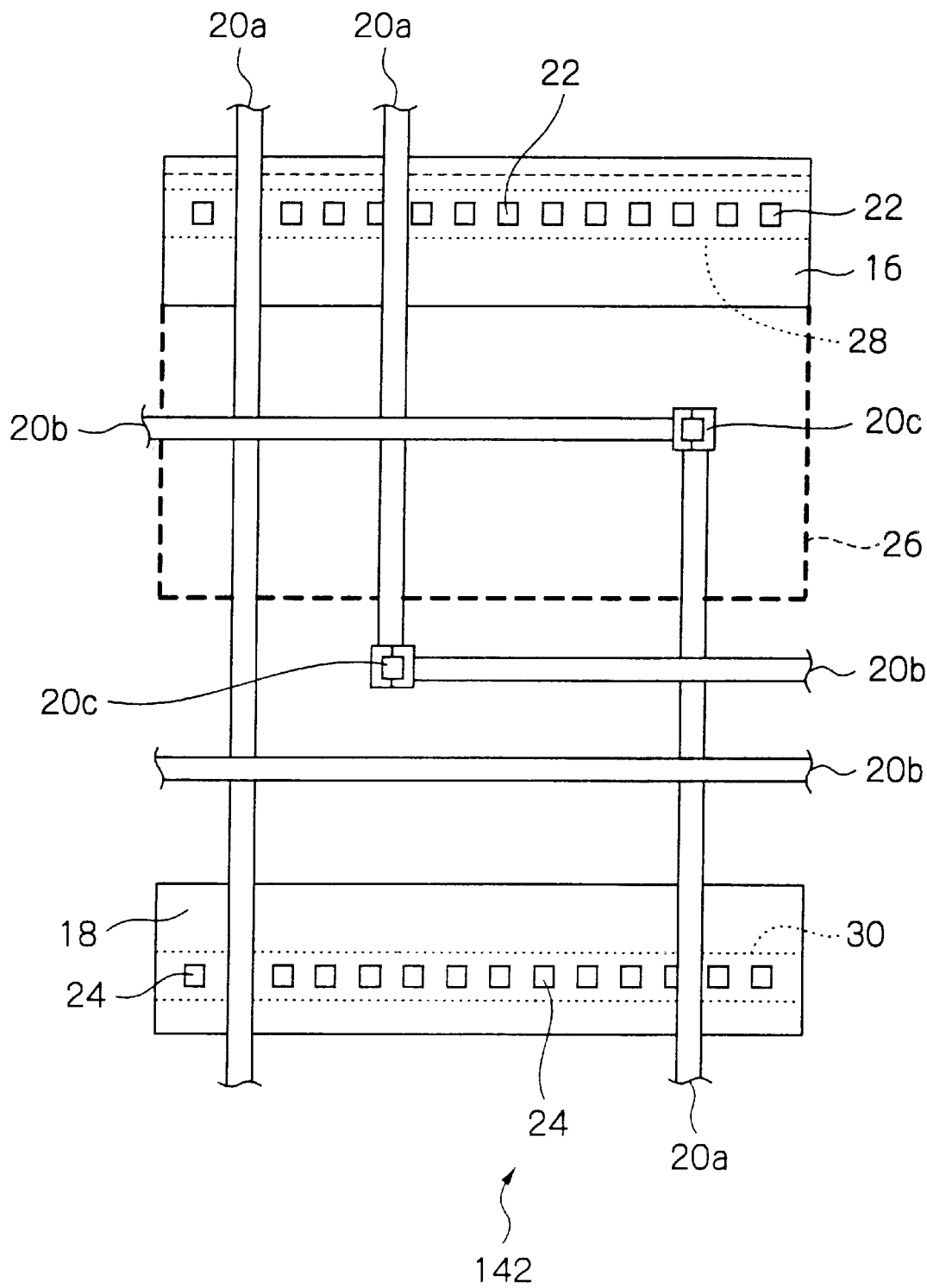
FIG. 3 is a plan view schematically showing a specific layout of a power supply line, a ground line and signal lines arranged in one of the wiring regions of the embodiment shown in FIG. 2.

FIG. 3 schematically shows a specific configuration of one of the wiring regions 142. As shown, the wiring region 142 does not include any transistor or similar active device, but an internal power supply strip 16, a ground strip 18, and signal metal wirings 20a and 20b. Those wirings and strips 16, 18, 20a and 20b are connected to the gate devices, not shown, of the adjoining logic circuit regions 140. The internal power supply strip 16 is provided with a plurality of contact pads 22 for power supply. Likewise, the ground strip 18 is provided with a plurality of contact pads 24 for grounding. Each of the signal metal wirings 20a and 20b is formed in a particular layer electrically isolated from the other layer. Metal through holes 20c provide interconnection between the signal metal wirings 20a and 20b. It is to be noted that oxide films, substrate, gate devices and other devices not directly relevant to the understanding of the present invention are neither shown nor will be described specifically.

Figure 4:
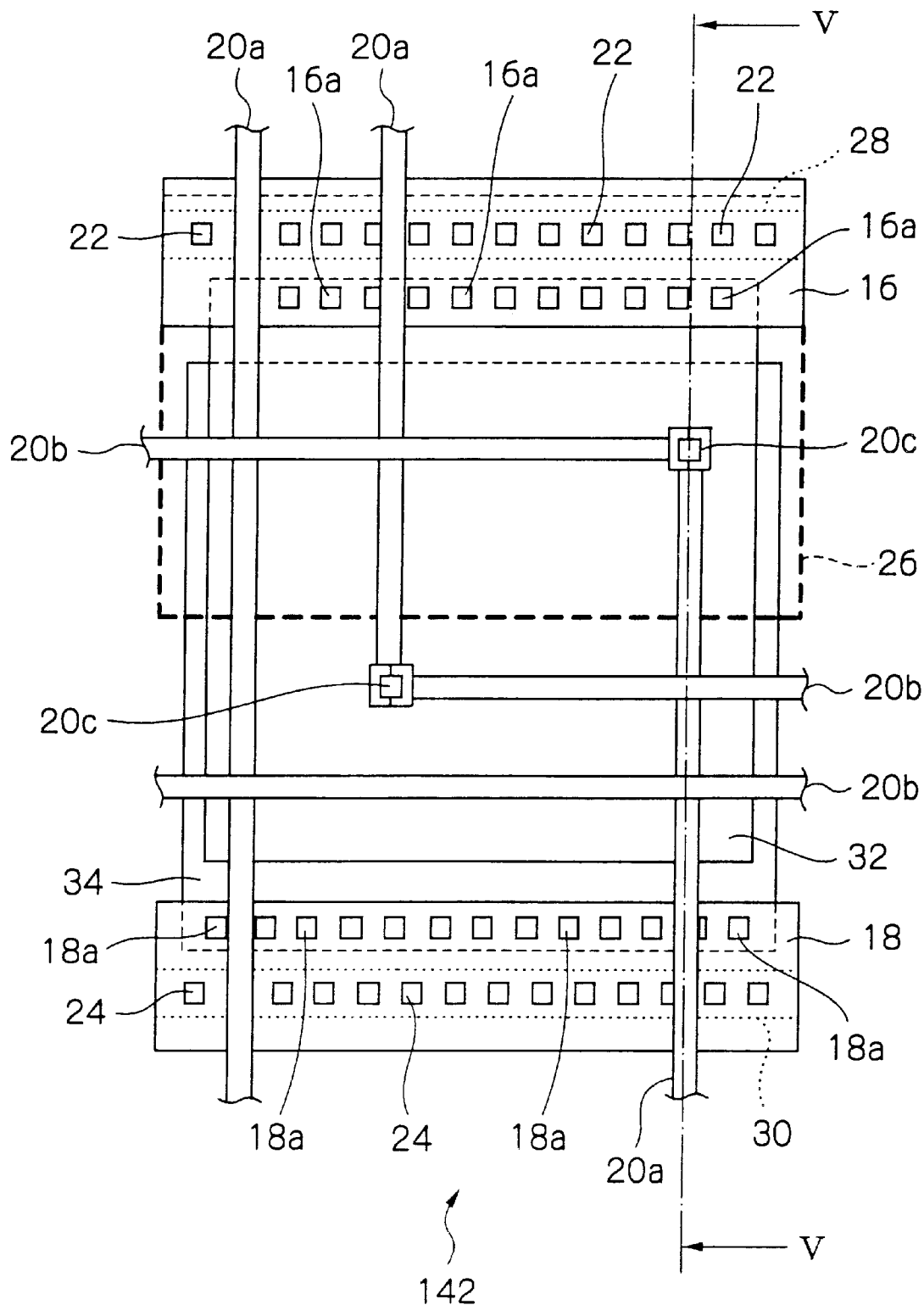
FIG. 4 is a plan view useful for understanding the more detailed layout of the wiring regions of the embodiment.

As shown in FIG. 4, considering interface between the wiring region 142 and the adjoining gate devices, the wiring region 142 may additionally include diffusion layers 26, 28 and 30. The diffusion layer 26, which is indicated by a thick, dashed line in FIG. 4, is an n-type potential well, p-type potential well or similar diffusion layer with lower diffusion density. The diffusion layers 28 and 30, which are indicated by thin dashed lines in the figure, are denser diffusion layers used to fix potential wells and substrate nodes.

Figure 5:
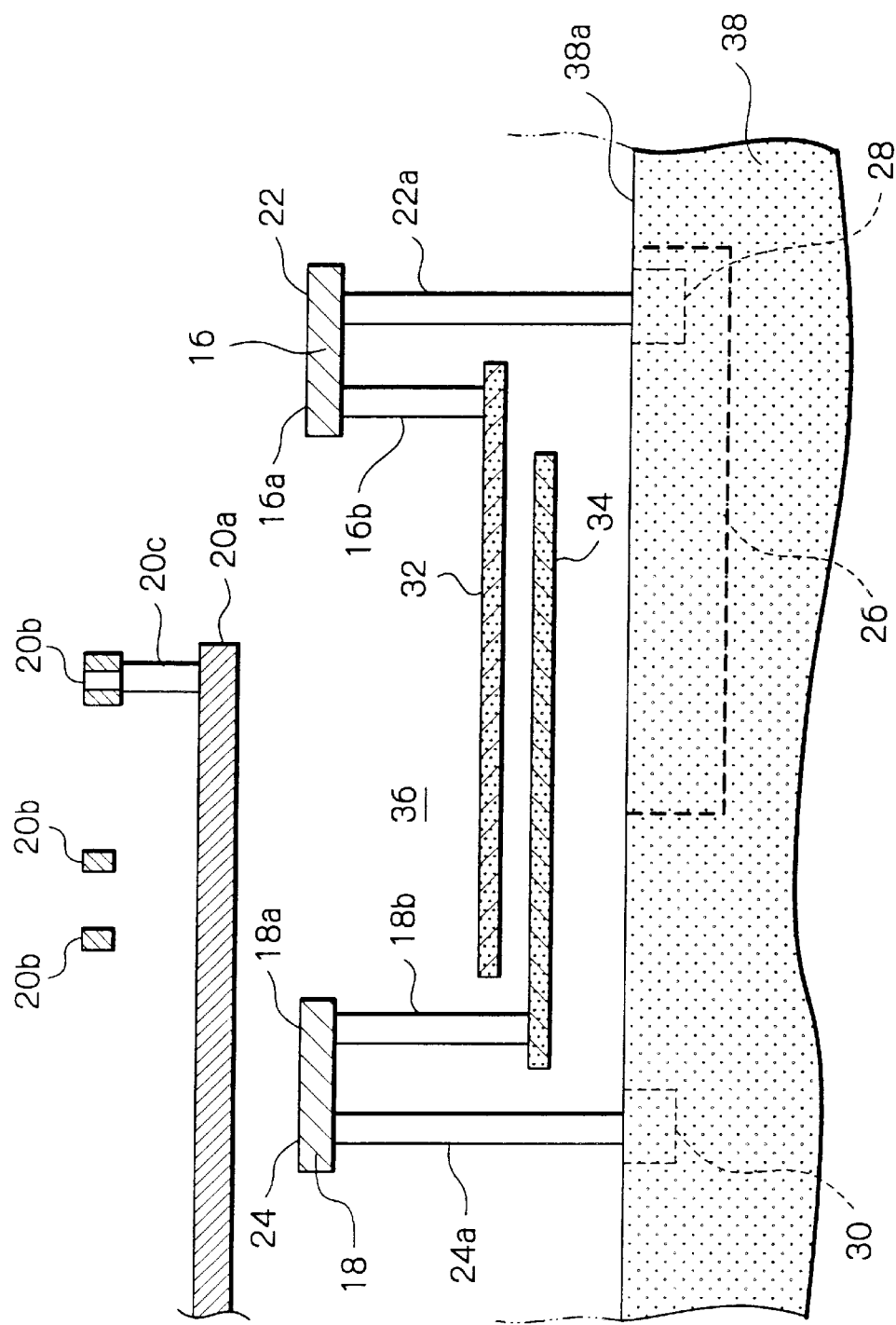
FIG. 5 shows a section along line V—V of FIG. 4.

As also shown in FIG. 4, in the illustrative embodiment, the wiring region 142 includes thin film layers 32 and 34 independent of each other and formed of polycrystalline silicon, which has been customarily with the gate electrodes of transistors. FIG. 5 is a section along line V—V of FIG. 4, showing more specifically the positions of the thin layers (polycrystalline silicon layers hereinafter) 32 and 34 in a direction perpendicular to one of the primary surfaces 38a of the semiconductor substrate 38. In FIG. 5, oxide or passivation layers, for example, are not shown for the simplicity of illustration. As shown, the polycrystalline silicon layer 32 is a flat layer substantially parallel to the one major surface 38a of the substrate 38. A node contact pad 16a is formed in the internal power source strip 16 and connected to the polycrystalline silicon layer 32, which is disposed in different level from the strip 16, by a metal through hole 16b. The other polycrystalline silicon layer 34 is also a flat layer extending substantially parallel to the major surface 38a of the silicon substrate 38. A node contact pad 18a is formed in the ground strip 18 and connected to the polycrystalline silicon layer 34, which is disposed in different level from the strip 18, by another metal through hole 18a.

The laminate structure shown in FIG. 5 will be sequentially described from the top to the bottom hereinafter. In FIG. 4, three signal metal lines 20b extend substantially perpendicularly to line V—V. Among them, the signal metal line 20b closest to the internal power supply strip 16 is connected by the metal through hole 20c to the signal metal line 20a, which underlies the signal metal line 20b and extends in parallel to line V—V. The internal power supply strip 16 and ground strip 18 underlie the signal metal line 20a and are formed of metal at, e.g., the same level. The polycrystalline silicon layers 32 and 34 are implemented as independent layers between the level of the internal power supply strip 16 and ground strip 18 and the semiconductor substrate 38.

More specifically, the internal power supply strip 16 includes a plurality of node contact pads 16a, each of which is connected to the polycrystalline silicon layer 32 by a particular metal through hole 16b. Likewise, the ground strip 18 includes another plurality of node contact pads 18a each connected to the polycrystalline silicon layer 34 by a particular metal through hole 18b. In this configuration, a capacitor is established between the polycrystalline silicon layers 32 and 34 via an intervening, electrically insulative layer 36, and connected to respective reference voltages, or a power supply and ground. This capacitor is assigned to a power supply circuit and plays the role of a stabilizing circuit against voltage fluctuation ascribable to the loads of the internal circuit portion 14. In FIG. 5, the reference numeral 36 is directed to the entire insulation layer, which is not shown by a sectional notation for the simplicity of illustration.

The internal power supply strip 16 is connected to the diffusion layer 26 by interconnecting the power supply pad 22 to the diffusion layer 28 via the metal through hole 22a, as described above. Also, the ground strip 18 is connected to the substrate 38 by interconnecting the grounding pad 24 to the diffusion layer 30 via the metal through hole 24a.

As stated above, the polycrystalline silicon layers 32 and 34 both are positioned below the signal metal wirings 20a and 20b, and therefore free from short-circuited with the metal wirings 20a and 20b. A parasitic capacitance exists in the portions of the oxide layer 36, or film thickness, between the polycrystalline silicon layers 32 and 34 and the signal metal wirings 20a and 20b. The parasitic capacitance may possibly delay signals in the circuitry. However, the delay of signals is generally negligible because the above film thickness is generally extremely great and close to the thickness of the portion of the oxide layer 36 between the signal metal wirings 20b and the substrate 38. Therefore, the delay does not matter at all so long as circuit design has a sufficient margin as to the operational speed of the circuit. On the other hand, in an application of the kind needing stricter timing control, circuit design should only take account of the parasitic capacitance and use simulations.

The diffusion layer 26 underlying the polycrystalline silicon layers 32 and 34 is densely doped and therefore does not allow, e.g., a transistor device to be formed. In this sense, the diffusion layer 26 has no influence on the circuitry.

Each of the capacitors formed between the polycrystalline silicon layers 32 and 34 in the wiring region 142 does not have a considerable capacitance. However, a number of wiring regions 142 adjoin the logic circuit regions 140, as shown in FIG. 2, such that the increased capacitance is established over the entire internal circuit portion 14. This makes it possible to reduce the region conventionally allocated to a capacitor for power supply, and therefore to prevent the area for laying out such a capacitor from increasing. An exclusive region customarily allocated to such a capacitor may even be omitted, depending on required capacitance.

Moreover, as shown in FIG. 2, the wiring regions 142 are distributed over the entire internal circuit portion 14. Therefore, a capacitor closest to any one of the logic circuit regions 140 absorbs the influence on power supply from load variation ascribable to the operation of gate devices present in the logic circuit region 140. The wiring regions 142 can therefore suppress voltage fluctuation more efficiently than the conventional remote capacitor region. In addition, the wiring regions 142 reduce the influence of interference more than MOS capacitance devices do, thus promoting efficient mounting.

Figure 6:
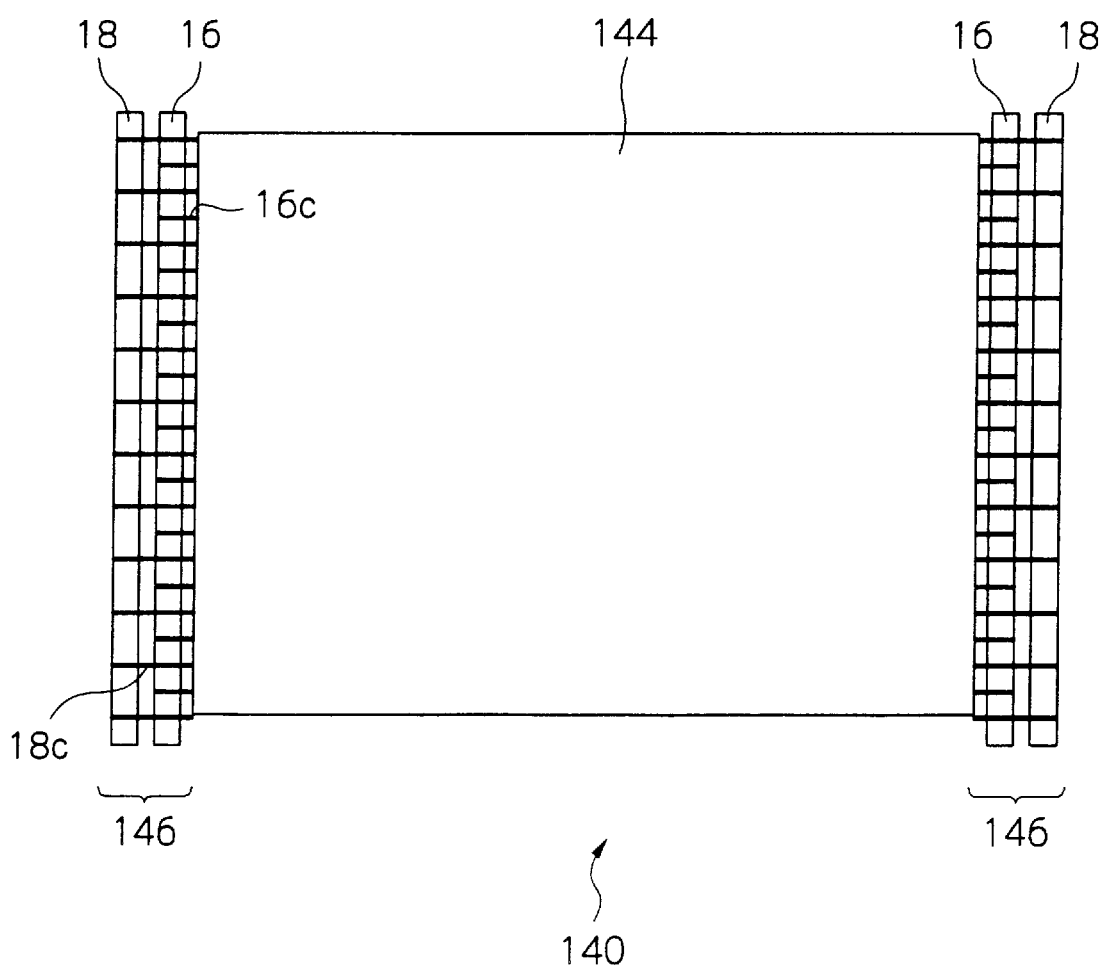
FIG. 6 is a plan view schematically showing a logic circuit region in accordance with an alternative embodiment of the present invention.

Reference will be made to FIG. 6 for describing an alternative embodiment of the present invention. In the alternative embodiment, structural elements like those of the previous embodiment are designated by identical reference numerals and will not be described specifically in order to avoid redundancy. As shown, the logic circuit regions 140 (only one is depicted) arranged in the internal circuit portion 14 each are generally made up of a circuit subregion 144 and two wiring subregions 146 sandwiching the circuit subregion 144. The circuit subregion 144 has various gate devices formed therein, but not shown for simplicity. The power supply strip 16 and ground strip 18 are formed in each of the two wiring subregions 146 in pair and extend substantially parallel to each other.

Figure 7:
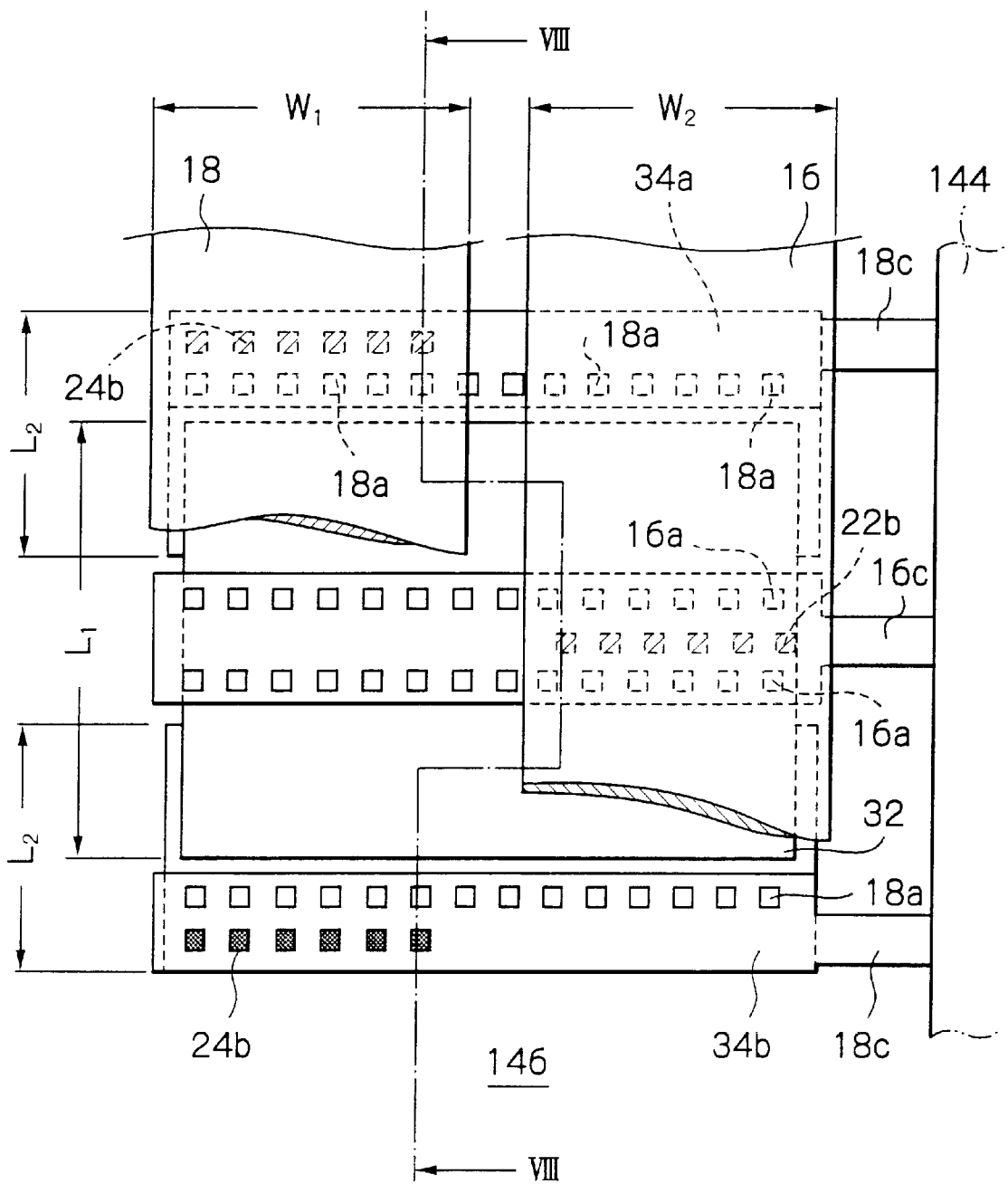
FIG. 7 is a partly taken away, fragmentary enlarged view of part of the logic circuit region shown in FIG. 6.
Figure 8:
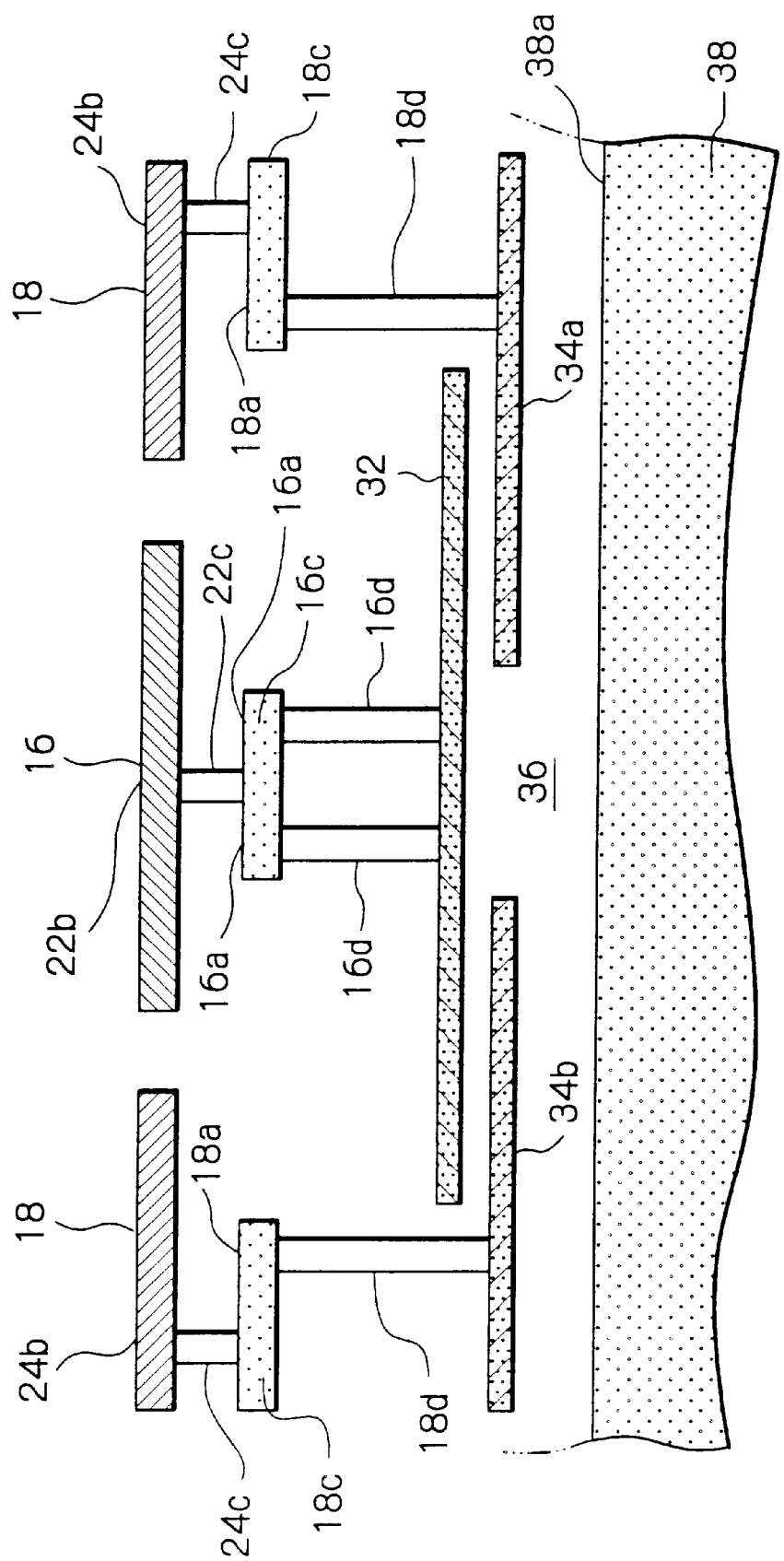
FIG. 8 is a sectional view, like FIG. 5, taken along line VIII—VIII of FIG. 7.

FIG. 7 shows the left one of the wiring subregions 146, as viewed in FIG. 6, in a fragmentary enlarged view. As shown, the power supply strip 16 and ground strip 18 extend in the vertical direction in the figure, and have widths of W1 and W2, respectively, as measured in the direction perpendicular to the longitudinal direction thereof. The polycrystalline silicon layer 32 and a pair of polycrystalline silicon layers 34a and 34b extend over the widths W1 and W2 each. As shown in FIG. 8 that is a section along line VIII—VIII of FIG. 7, the polycrystalline silicon layer 32 forms a layer relating to the power supply strip 16. This is why the polycrystalline silicon layer 32 is slightly shorter in width than the polycrystalline silicon layers 34a and 34b, and has a length of L1, as seen in FIG. 7.

A power feed line 16c is formed in a layer underlying the power supply strip 16 and extends substantially perpendicularly to the lengthwise direction of the strip 16. Contact pads 22b for power supply are represented by hatched squares in FIG. 7 and arranged at intervals preselected by taking account of the width W2 of the power supply strip 16. The contact pads 22b connect the power supply strip 16 to the feed line 16c. The node contact pads 16a, which are represented by blank squares, are arranged at preselected intervals along both sides of the feed line 16c, sandwiching the power-supply contact pads 22b. The number of the node contact pads 16a is suitably selected in matching relation to the width of the polycrystalline silicon layer 32.

The polycrystalline silicon layers 34a and 34b are formed in pair. The polycrystalline silicon layer 34a is slightly longer in width than the polycrystalline silicon layer 32 in the horizontal direction, as viewed in FIG. 7, and has a length of L2 in the vertical direction. The polycrystalline silicon layer 34a therefore has a smaller area than the polycrystalline silicon layer 32. As shown in FIG. 7, the other polycrystalline silicon layer 34b has the same size as the polycrystalline silicon layer 34a and faces it with the intermediary of the feed line 16c. Therefore, the total area of the polycrystalline silicon layers 34a and 34b is greater than the area of the polycrystalline silicon layer 32.

Each of the polycrystalline silicon layers 34a and 34b includes a ground line 18c formed in a layer underlying the ground strip 18 and extending substantially perpendicularly to the lengthwise direction of the wiring 18. Ground contact pads 24b represented by black or hatched squares are arranged at intervals preselected by taking account of the width W1 of the ground strip 18. The ground contact pads 24b connects the ground strip 18 to the ground line 18c. Node contact pads 18a are arranged at preselected intervals only on one side of the ground lines 18c which faces the feed line 16c. The number of the node contact pads 16a, which are represented by blank squares, is suitably selected in accordance with the width of the polycrystalline silicon layer 32.

In the illustrative embodiment, power-feeding and grounding the gate devices included in the circuit subregion 144 are thus effected at the regions distinct and separate from each other. Generally, the width W1 of the power supply strip 16 and the width W2 of the ground strip 18 are great enough to obviate the influence of parasitic resistance ascribable to wiring.

Interconnection between the polycrystalline silicon layers 32, 34a and 34b and the lines associated therewith will be described more specifically with reference to the vertical sectional view shown in FIG. 8. As shown, the internal power supply strip 16 is connected by a metal through hole 22c, which is formed immediately beneath the power supply contact pad 22b, to the feed line 16c. The feed line 16c is connected to the polycrystalline silicon layer 32 by the arrays of metal through holes 16d—16d and the arrays of node contact pads 16a—16a, which are formed on both sides of the array of metal through hole 22c in the plan view shown in FIG. 7. In the areas above the polycrystalline silicon layers 34a and 34b, the ground strip 18 is connected to the ground lines 18c by the array of metal through holes 24c, which are formed immediately beneath the array of ground contact pads 24b. Further, each of the ground lines 18c connects the node contact pads 18a provided thereon to associated one of the polycrystalline silicon layers 34a and 34b via the metal through holes 18d.

The polycrystalline silicon layers 32, 34a and 34b are thus formed in the unique configuration described above and connected region by region. As a result, a capacitor is formed between the overlapping portions of the polycrystalline silicon layers 32 and each of the polycrystalline silicon layers 34a and 34b in the direction normal to the substrate 38. Again, the polycrystalline silicon layers 32, 34a and 34b are positioned below the metal wirings forming the feed line 16c and ground lines 18c, and therefore do not bring about short-circuiting or similar trouble.

The substrate 38 is positioned below the polycrystalline silicon layers 32, 34a and 34b. The substrate 38 is thicker and involves a minimum of parasitic capacitance. This, coupled with the fact that the substrate 38 is of the ground level or the power supply level, prevents the above-described parasitic capacitance from effecting the gate devices of the circuit subregion 144.

As stated above, by arranging capacitors around the circuit subregion 144, the illustrative embodiment increases the total capacitance that can be inserted or provided in the semiconductor IC 10. The illustrative embodiment therefore makes the layout shown in FIG. 1 more workable without resorting to exclusive regions that have heretofore been allocated to capacitors for establishing desired capacitance for power supply. Consequently, the total area of the semiconductor IC 10 will be reduced. Another advantage achievable with the capacitors formed around the circuit subregion 144 is that they absorb noise generated inside and outside of the semiconductor IC 10.

In the foregoing embodiments, the polycrystalline silicon layers 32 and 34 (34a and 34b) are connected to the power supply strip 16 and ground strip 18, respectively. The invention is not restricted to the specific configuration described above. If desired, the polycrystalline silicon layers 32 and 34 (34a and 34b) may be connected in reverse, i.e. to the ground strip 18 and power source strip 16, respectively. Further, in the embodiments shown and described, the capacitors are formed inside or around the internal circuit portion 14. Such capacitors may, of course, be formed in circuit portions including analog circuitry and memory circuitry or wiring regions for connecting such circuitry so far as the wiring regions, internal power supply and ground wiring are available in those circuit portions.

Figure 9:
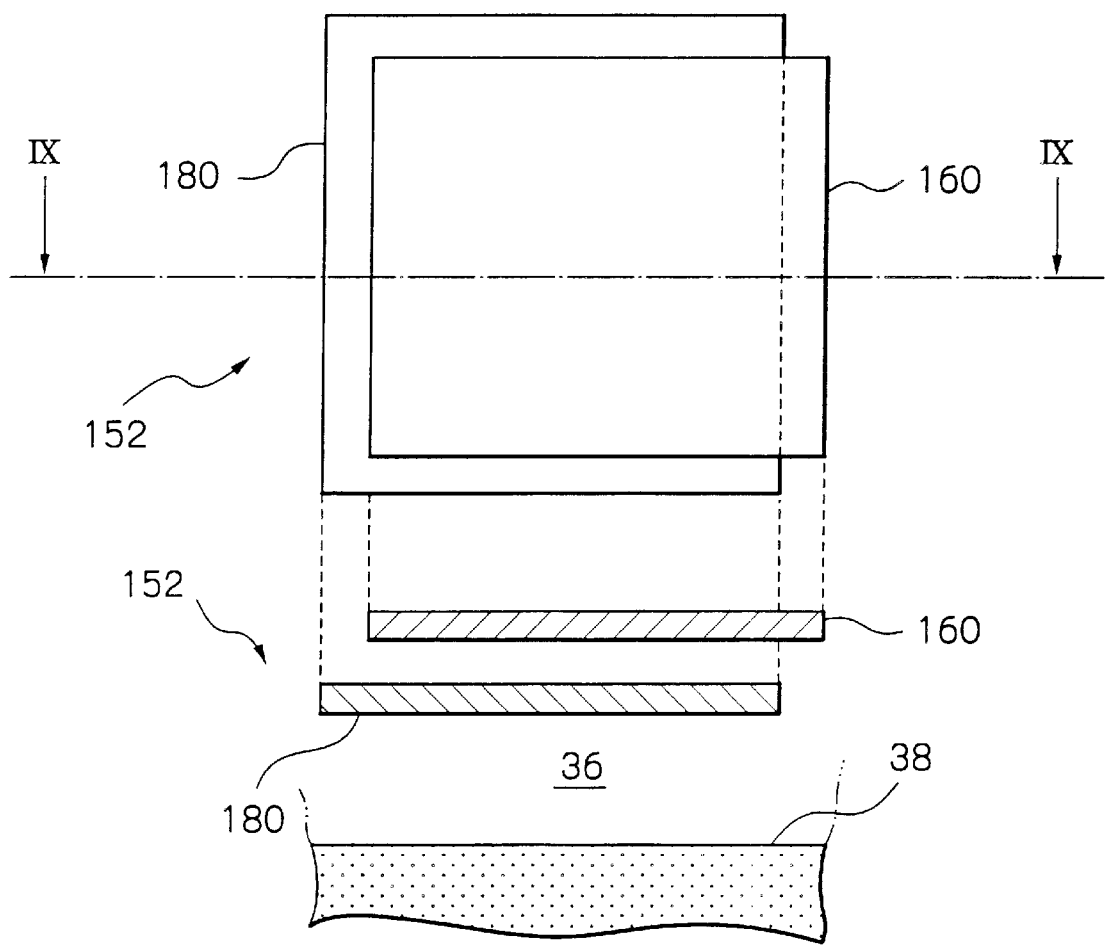
FIG. 9 shows, in a plan view and a section, a capacitor structure implemented by a multilayer structure in accordance with another alternative embodiment of the present invention.

Reference will now be made to FIG. 9 for describing another alternative embodiment of the present invention. In the embodiment to be described, structural elements like those of the embodiments described above are designated by identical reference numerals and will not be described in order to avoid redundancy. Briefly, in the illustrative embodiment, the semiconductor IC 10 has a multilayer structure, i.e. a plurality of layers arranged three-dimensionally and interconnected in relation to each other. The multilayer structure promotes effective wiring, as known in the art.

FIG. 9 shows the multilayer structure in a plan view in its upper half and also a section taken along line IX—IX of the upper half in its lower half. In the illustrative embodiment, the multilayer structure is made up of three layers, i.e., a top, an intermediate and a bottom layer by way of example. The insulation layer or oxide film 36 isolating nearby layers is not shown with a cross-sectional denotation for the simplicity of illustration. The reference numeral 152 designates a portion in which no wirings are formed on the second and third layers. Flat metal layers 160 and 180 are respectively formed on the second and third layers over substantially the entire portion 152. The metal layer 160 is used to feed an internal power supply while the other metal layer 180 is of the ground level. The metal layers 160 and 180 are connected to the first layer by metal through holes not specifically shown.

The insulation layer 36 has an interlayer part formed in the area over which the metal layers 160 and 180 overlap each other in the direction normal to the substrate 38. The interlayer part functions as a capacitor for power supply. Generally with a multilayer IC structure, the area 152 not used for wiring exists in various portions and should preferably be effectively used to form capacitors.

While a capacitor for power supply is formed by the second and third metal layers of the illustrative embodiment, it may also be formed between any ones of the top through bottom layer of the multilayer structure.

The insulation layer or interlayer film 36 is thick so that it establishes a very much small capacitance for a unit area. However, the capacitor formed between the metal layers 160 and 180 can have a great area in a plan view so that it sufficiently attains a desired capacitance. This is also successful to prevent the layout area from increasing due to the arrangement of capacitors.

The metal layers 160 and 180 may be formed in the upper layers with desired utility circuits arranged below and concealed by the metal layers and wired. This configuration makes it difficult to see the utility circuits by eye and is therefore desirable from the security standpoint. In addition, the capacitor between the metal layers 160 and 180 thus formed plays the role of a shield for protecting the semiconductor IC from extraneous noise.

It is to be noted that the polycrystalline silicon layers or the metal layers forming a capacitor therebetween may have any desired shape so long as the capacitor is workable.

Figure 10:
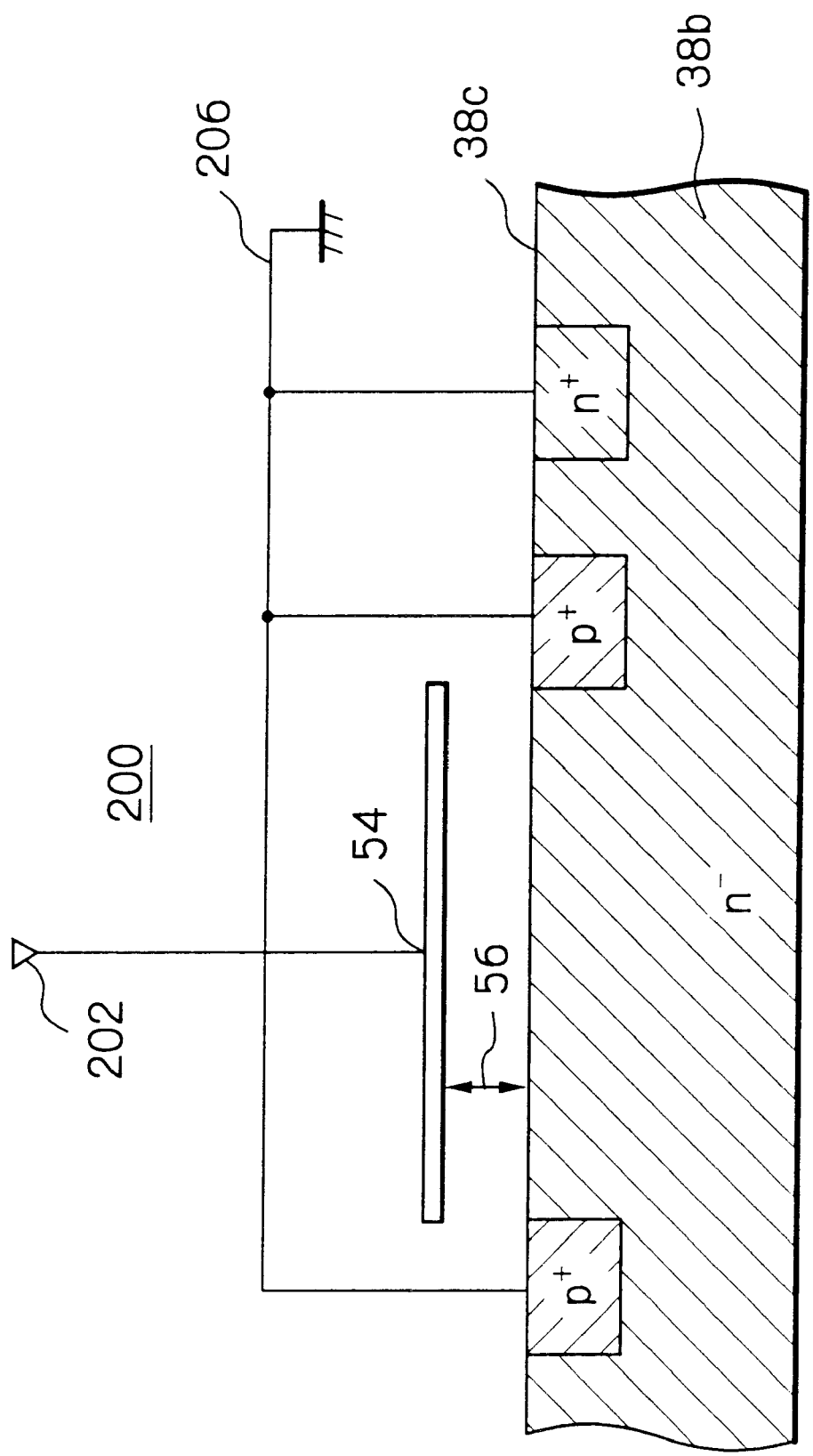
FIG. 10 is a partly sectioned, schematic circuit diagram showing specific connection of a p-type MOS feasible for the formation of a capacitor.

The two independent polycrystalline silicon layers forming a capacitor therebetween may be replaced with a transistor if the capacitance is small enough to avoid interference, as will be described hereinafter. The transistor for this application should preferably be implemented as an insulated-gate MOS transistor. FIG. 10 shows an insulated-gate p-channel MOS transistor 200 by way of example. As shown, the p-channel MOS transistor 200 has a gate electrode 54 connected to a power supply terminal 202 for receiving a power supply voltage. The transistor 200 has $p^+$ and $n^+$ wells formed in a substrate 38b and corresponding to a source and a drain region connected to a grounded terminal 206 as depicted. In the figure, an insulation of oxide layer over the primary surface 38c of the substrate 38b is not shown for simplicity. In this configuration, when the transistor 200 operates as a capacitor, a depletion layer is not formed in the range covered with the gate electrode 54. Consequently, a distance 56 between the gate electrode 54 and the substrate 38b or the wells remains constant, allowing the capacitance of the capacitor to remain constant.

Figure 11:
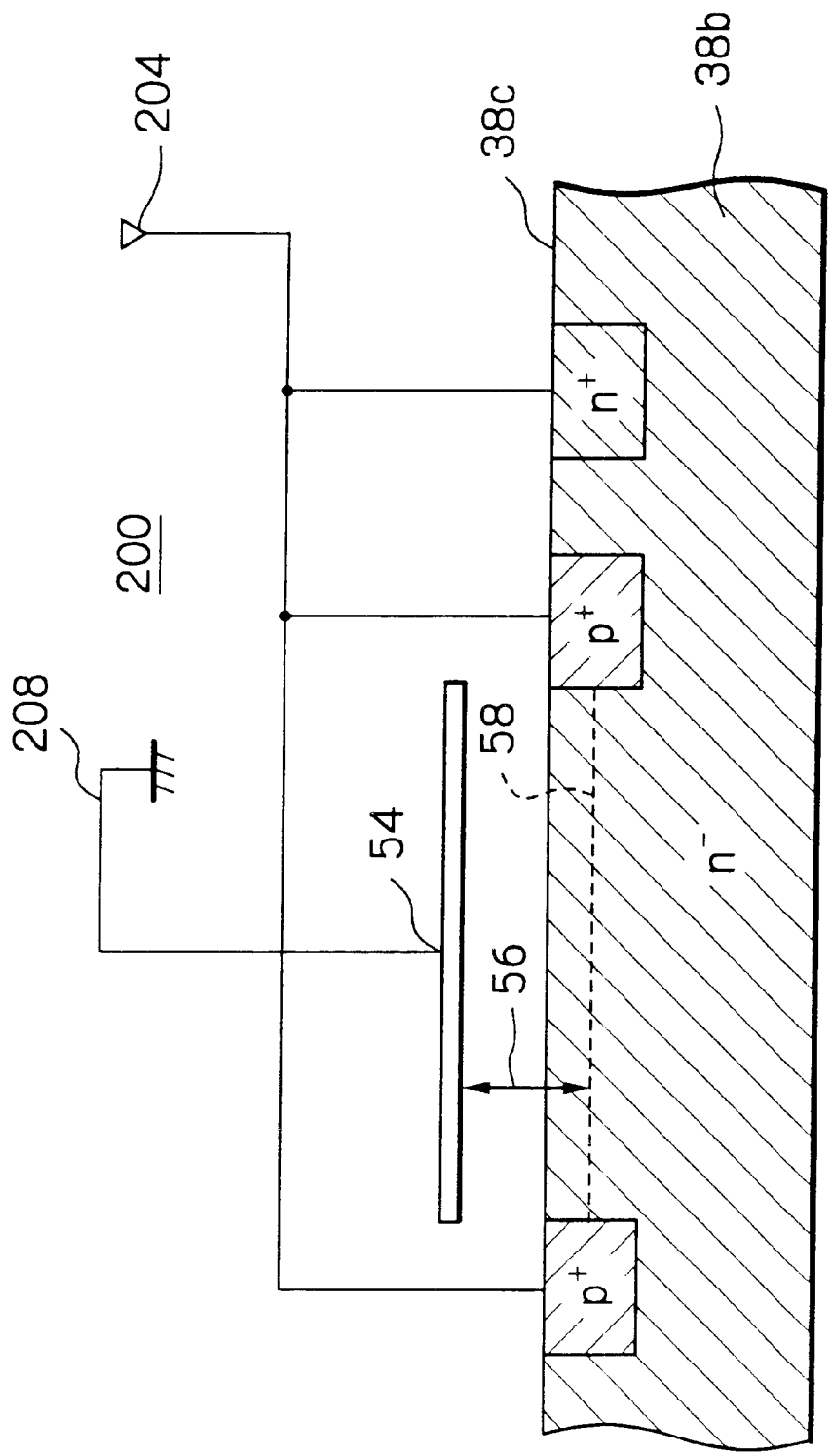
FIGS. 11 and 12 are views, similar to FIG. 10, useful for understanding particular conventional connection of a p-type and an n-type MOS, respectively.

FIG. 11 shows a conventional connection of the p-channel MOS transistor 200. As shown, the gate electrode 54 is connected to ground 208. A power supply terminal 204 is connected to the $p^+$ and $n^+$ wells formed in the substrate 38b and corresponding to the source and drain regions. In this condition, a depletion layer is formed in the substrate 38b over the range covered with the gate electrode 54, i.e., between the $p^+$ wells. The depletion layer is formed to a depth indicated by a dashed line 58 in FIG. 11, thus increasing the virtual distance between the gate electrode 54 and the substrate 38b from the actual distance 56. Because the capacitance of a capacitor is inversely proportional to the virtual distance, the capacitance decreases with an increased, virtual distance.

Figure 12:
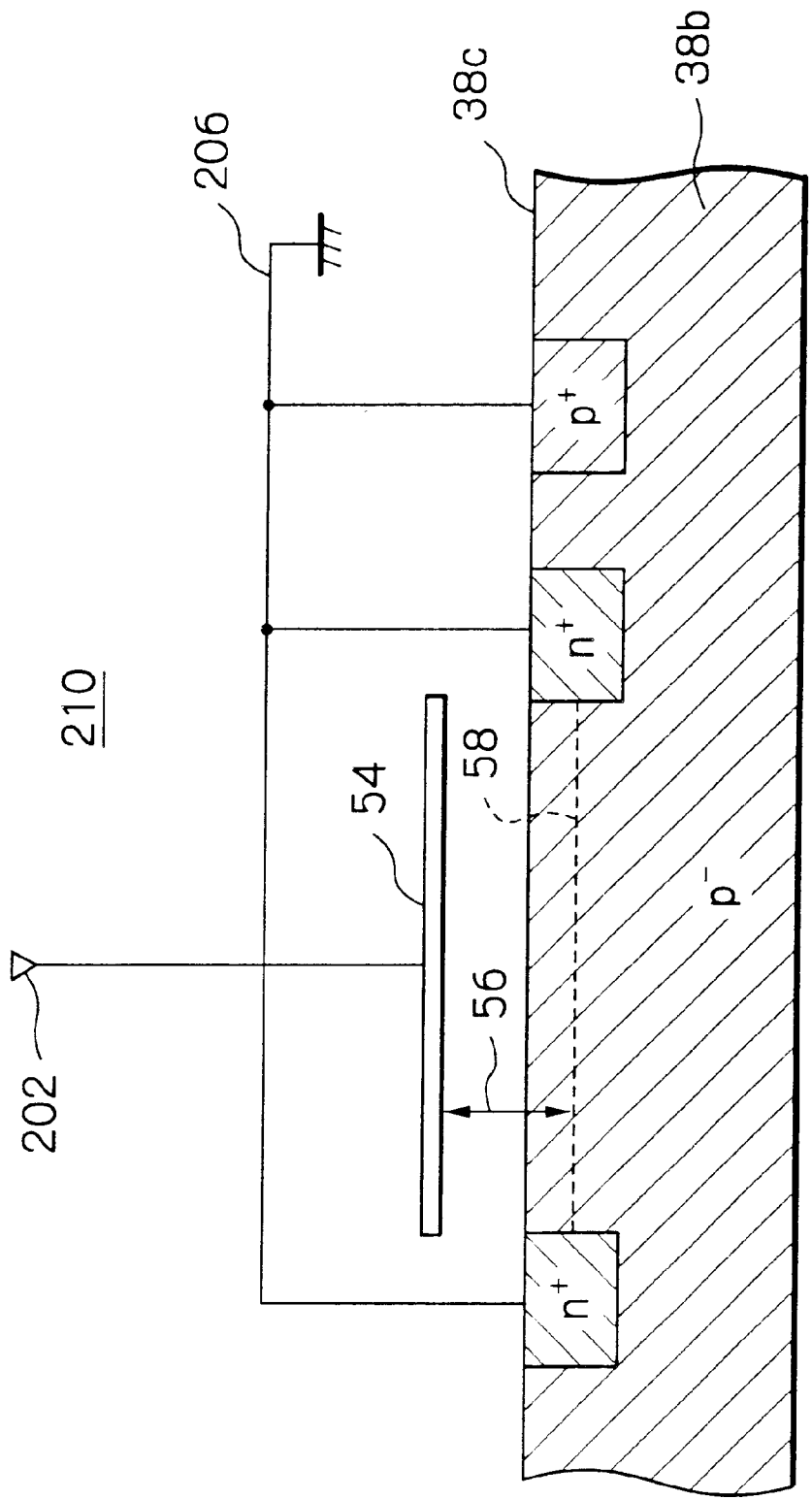

Further, FIG. 12 also shows another conventional connection of the insulated-gate n-channel MOS transistor 210. As shown, the gate electrode 54 of the n-channel MOS transistor 210 is connected to a power supply line 202 while $n^+$ wells and a $p^+$ well, which correspond to source and drain regions, are connected to ground 206. A depletion layer is formed in the substrate 38b over the range covered with the gate electrode 54, i.e., between the $n^+$ wells. The depletion layer is also formed to the depth indicated by the dashed line 58. This also increases the virtual distance from the actual distance 56 between the gate electrode 54 and the substrate 38a, and therefore reduces the capacitance of the capacitor.

It will be seen that the connection of the insulated-gate p-channel MOS transistor shown in FIG. 10 attains greater capacitance than capacitance available with the conventional MOS transistor. Taking account of the connection shown in FIG. 10, the illustrative embodiment uses an insulated gate p-channel transistor for cell-based design, and assigns the inside of cells only to a gate and a diffusion layer. It follows that capacitors arranged in wiring regions have no adverse influence on an automatic wiring tool.

The connection particular to the present invention obviously differs from the IC taught in Japanese patent laid-open publication No. 2682397 mentioned earlier and including a p- and an n-channel MOS transistor connected between a power supply and ground. More specifically, with the IC of the above document, the p-channel MOS transistor has a gate electrode connected to ground potential and a diffusion layer connected to power supply potential. Also, the n-channel MOS transistor has a gate electrode connected to the power supply potential and a diffusion layer connected to the ground potential. The use of the p-channel MOS transistor unique to the illustrative embodiment should preferably be checked by simulations beforehand in order to avoid interference with, e.g., logic circuits.

Referring to FIG. 13, an automatic LSI designing system for practicing the method of the present invention will be described. As shown, the system, generally 100, includes a CPU (Central Processing Unit) 102, a memory 104, an interface controller 106, a data input unit 108, a display 110, and a storage 112. The CPU 102, memory 104 and interface controller 106 are interconnected by a CPU bus 120 as illustrated.

The CPU 102 sequentially reads out program sequences for LSI design, performs calculations and operations to satisfy conditions input from the outside of the system 100, and then determines the device layout of an LSI as well as wiring. In practice, the CPU 102 determines the layout and wiring of several ten thousand to several hundred thousand cells to be dealt with by an LSI. The memory 104 includes an SDRAM (Synchronous Dynamic Random Access Memory) and a memory controller although not shown specifically. The memory controller controls the memory locations and operational timing of the SDRAM.

The data input unit 108, display 110 and storage 112 are connected to the interface controller 106, which is, in turn, connected to the CPU bus 120. The interface controller 106 includes, e.g., a PCI (Peripheral Component Interconnect) bus controller not shown. Connected to the PCI controller are an interface controller, a display controller, an IDE (Integrated Device Electronics) controller and an SCSI (Small computer System Interface) interface although not shown specifically. The interface controller includes a keyboard and a mouse, not shown, and assigned to the data input unit 108 while the display controller, not shown, is assigned to the display 110. The PCI bus controller transfers data input from peripherals to the CPU 102 and memory 104 over the CPU bus 120.

The data input unit 108 includes, in addition to the keyboard and mouse, a modem, not shown, to which data is input via external communication. The display 110 visually displays information showing input conditions relating to layout and wiring as well as the results of calculations resulting from the input conditions.

The storage 112 is implemented as a hard disk drive or a RAID (Redundant Arrays of Inexpensive Disks) unit. The storage 112 is adapted to store various kinds of information necessary for layout design as well as resultant circuit pattern data produced by the layout design. The various kinds of information include, e.g., a network list listing the connections of logic circuits, a library for cell design and macro design, and program sequences for function and logic design.

The automatic LSI designing system 100 sequentially reads out the function and logic design programs from the storage 112. By using a layout program, which is one of the function and logic design programs, the system 100 lays out cells in a block. The system 100 then performs calculations and operations for forming capacitors of any one of the illustrative embodiments in the vicinity of regions where logic circuits should be formed.

A specific procedure for capacitor layout design to which the method of the present invention is applied will be briefly described with reference to FIGS. 14A through 14D. First, the automatic LSI designing system 100 executes floor planning for sequentially determining block division or partitioning, the shape of a block, and the placement of blocks. The system 100 then places cells in a block in accordance with the shape determined by the floor planning.

Figure 14A:
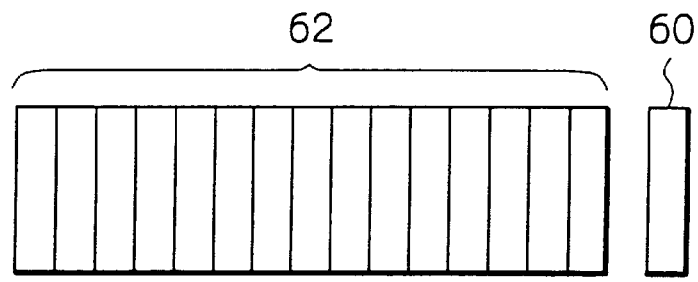
FIGS. 14A through 14D demonstrate a specific procedure for forming capacitors with the automatic designing system shown in FIG. 13 in accordance with the invention.
Figure 14B:
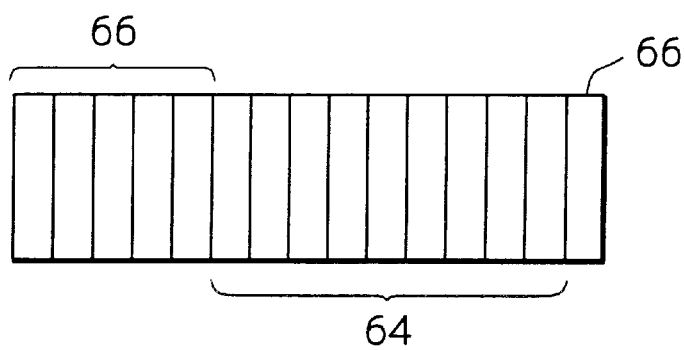

More specifically, as shown in FIG. 14A, cell placement is effected by use of standard or unit cells 60 adaptive to various basic logic circuits. The standard cells 60 are identical in height, but different in width in the figure. A plurality of standard cells 60 are arranged in cascade, thus constituting a single block 62. Subsequently, as shown in FIG. 14B, the block 62 is classified into a zone 64 for lying out logic circuits and another zone 66 for laying out wirings. The classification guarantees the zone 64 for forming a utility circuit, or circuitry in accordance with logic circuits to be used. The zone 66 is allocated to wirings for connecting the logic circuits that lie in the zone 64. The cells in the zone 66 function as feed-through cells.

Figure 14C:
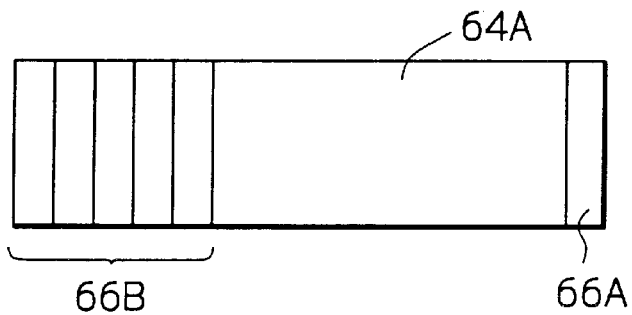
Figure 14D:
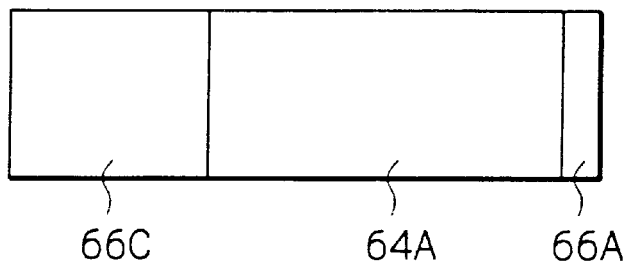

As shown in FIG. 14C, the above classification forms a logic circuit region 64A and a wiring region 66A. The rest of the zone 66 forms an idle region 66B different from the logic circuit region 64A and wiring region 66A. The system 100 counts the standard cells 60 existing in the idle region 66B. The system 100 then compares the number of such standard cells 60 with a preselected number or threshold, thereby determining whether or not the preselected number of cells 60 exist in a continuous array in the idle region 66B. If the number of cells existing in the idle region 66B is greater than the preselected number, then the system 100 couples the standard cells 60 to each other to thereby convert them to a capacitance device. As a result, as shown in FIG. 14D, the idle region 66B is transformed to a capacitor device, i.e., a capacitor forming region 66C. If the number of cells 60 in the idle region 66B is smaller than the preselected number, then the system 100 temporarily lays out wirings.

In the above specific procedure, the system 100 forms a capacitor in the fully idle region 66B. Alternatively, the system 100 may execute layout design in such a manner as to form a capacitor in any one of the wiring region 142 shown in FIG. 4, the wiring region 146 shown in FIG. 6 and the region of the multilayer structure shown in FIG. 9. In forming those regions, one polycrystalline silicon layer is connected to a power supply while the other polycrystalline silicon layer is connected to ground, so that a capacitor for a power supply circuit is formed between the overlapping polycrystalline silicon layers.

In summary, the present invention provides a semiconductor IC in which polycrystalline silicon layers forming a capacitor and metal wirings each are formed in a particular layer. The IC is therefore free from short-circuiting. This, coupled with the fact that film thickness is great enough to obviate the influence of signal delay ascribable to parasitic capacitance, allows capacitors to be mounted more efficiently for a given layout area than when MOS capacitor devices are used.

Further, capacitors arranged around circuit regions, i.e., macro cells increase capacitance that can be inserted in an LSI. It follows that a capacitance required of a power supply circuit for a utility circuit can be implemented without resorting to exclusive regions for capacitors. This further reduces the necessary area and absorbs noise generated inside and outside of circuitry.

Moreover, two layers different from a wiring layer and implemented by a multilayer technology are connected to a power supply and ground, respectively. This insures a sufficient capacitance and thereby prevents the layout area from increasing due to capacitors provided. When a capacitor is formed above a desired circuit, the former conceals the latter to thereby enhance security and shielding effect.

Also, the present invention provides an automatic designing method that ensures a cell region for forming circuit devices, determines whether or not a capacitor can be formed in a wiring layer or an idle region to thereby ensure a capacitor forming region, and forms a capacitor with two polycrystalline silicon layers. The method therefore makes it needless to form capacitors customary with, e.g., an LSI, thereby enhancing efficient mounting to a chip. In addition, the polycrystalline silicon layers forming a capacitor for power supply obviate interference ascribable to a MOS capacitance device.

While the present invention has been described with reference to the particular illustrative embodiments, it is not to be restricted by the embodiments. It is to be appreciated that those skilled in the art can change or modify the embodiments without departing from the scope and spirit of the present invention.

What we claim is:

1. A semiconductor IC (Integrated Circuit) comprising:
   a power supply circuit for feeding a voltage to a utility circuit; and
   a stabilizing circuit for stabilizing the voltage to be applied to the utility circuit;
   wherein said IC includes a semiconductor substrate generally of $n^-$ conductivity type having a primary surface, and first and second layers formed over the primary surface differently in level in a direction normal to the primary surface;
   said IC having regions, in which said stabilizing circuit and utility circuit are formed, being divided into a plurality of blocks each constituting a standard cell,
   connections of circuit devices included in the standard cells and forming the utility circuit being wired in a wiring region in the first layer,
   said stabilizing circuit comprising
   $p^+$ and $p^+$ wells formed in an $n^-$ region of said substrate and connected to ground, the $p^+$ wells corresponding to a source and a drain, respectively;

said second layer being formed over the n⁻ region of said substrate and being connected to a reference voltage.

2. The semiconductor IC in accordance with claim 1, further comprising first and second electrodes each containing polycrystalline silicon and interconnected to said second layer and said p⁺ and n⁺ wells, respectively.

3. The semiconductor IC in accordance with claim 2, wherein said wiring region comprises a region which adjoins a macro cell forming the utility circuit with a plurality of cells, and in which a power source wiring and a ground wiring extend.

4. The semiconductor IC in accordance with claim 2, wherein said first and second electrodes are formed in a part of a region, which is different from regions where the utility circuit and the wiring are formed and in which idle cells are positioned.

5. The semiconductor IC in accordance with claim 1, further comprising first and second electrodes each containing metal and interconnected to said second layer and said p⁺ and n⁺ wells, respectively.

6. A method of automatically designing a semiconductor IC (Integrated Circuit) including a power supply circuit for feeding a voltage to a utility circuit and a stabilizing circuit for stabilizing the voltage, comprising the steps of:

preparing a plurality of block regions forming the IC, and dividing each of the plurality of block regions into unit subregions each constituting a standard cell;

classifying the unit subregions into a first subregion for the utility circuit and a second subregion for wiring connections of the utility circuit;

determining a number of standard cells adjoining each other in an idle subregion not classified during said classifying;

coupling the standard cells, if a number of standard cells in the idle subregion is greater than a preselected number;

preparing a semiconductor substrate generally of n⁻ conductivity type having a primary surface;

forming in the idle subregion a first electrode and a second electrode in a first layer and a second layer, respectively, which are different in level in a direction normal to the primary surface of the n⁻ region of the semiconductor substrate on which the IC is to be formed; and forming p⁺ and n⁺ wells in said substrate and connected to ground, the p⁺ wells corresponding to a source and a drain, respectively, said second layer being formed over the n⁻ region of said substrate and connected to a reference voltage.

7. The method in accordance with claim 6, further comprising connecting the first and second electrodes to a first terminal for receiving a ground potential and a second terminal for receiving the reference voltage, respectively.

8. The method in accordance with claim 6, wherein during said forming the first and second eleotrodes, the first and second electrodes are formed in a part of a region, which is different from regions where the utility circuit and the wiring connections are formed and in which idle cells are positioned.

9. The method in accordance with claim 6, wherein the first and second electrodes each contain polycrystalline silicon.

10. The method in accordance with claim 6, wherein the first and second electrodes each contain metal.

* * * * *